United States Patent
Akram et al.

(10) Patent No.: US 11,843,317 B2
(45) Date of Patent: Dec. 12, 2023

(54) PSEUDO-BYPASS MODE FOR POWER CONVERTERS

(71) Applicant: Cirrus Logic International Semiconductor Ltd., Edinburgh (GB)

(72) Inventors: Hasnain Akram, Austin, TX (US); Graeme G. Mackay, Austin, TX (US); Jason W. Lawrence, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 107 days.

(21) Appl. No.: 17/550,492

(22) Filed: Dec. 14, 2021

(65) Prior Publication Data
US 2023/0067877 A1    Mar. 2, 2023

Related U.S. Application Data

(60) Provisional application No. 63/236,739, filed on Aug. 25, 2021.

(51) Int. Cl.
*H02M 3/158* (2006.01)
*H02M 1/00* (2006.01)
*H02M 1/32* (2007.01)
*G01R 19/165* (2006.01)

(52) U.S. Cl.
CPC ...... *H02M 3/158* (2013.01); *G01R 19/16538* (2013.01); *H02M 1/0009* (2021.05); *H02M 1/0025* (2021.05); *H02M 1/32* (2013.01)

(58) Field of Classification Search
CPC .. H02M 3/158; H02M 1/0009; H02M 1/0025; H02M 1/32; G01R 9/16538
See application file for complete search history.

(56) References Cited

U.S. PATENT DOCUMENTS

| | | |
|---|---|---|
| 5,428,524 A | 6/1995 | Massie |
| 5,617,016 A | 4/1997 | Borghi et al. |
| 5,757,167 A | 5/1998 | Arora et al. |
| 6,177,783 B1 | 6/2001 | Donohue |
| 6,597,158 B2 | 7/2003 | Umeda |
| 7,102,340 B1 | 9/2006 | Ferguson |
| 7,190,150 B2 | 3/2007 | Chen et al. |

(Continued)

FOREIGN PATENT DOCUMENTS

| | | |
|---|---|---|
| CN | 110784140 A | 2/2020 |
| CN | 112953242 A | 6/2021 |

(Continued)

OTHER PUBLICATIONS

Stmicroelectronics NV, AN4218—Hardware design guideline power supply and voltage measurement—Application Note, Doc ID 024014 Rev 3, 26 pages, Oct. 2015.

(Continued)

*Primary Examiner* — Rafael O De Leon Domenech
(74) *Attorney, Agent, or Firm* — Jackson Walker L.L.P

(57) ABSTRACT

A system may include a boost converter configured to receive an input voltage and boost the input voltage to an output voltage and control circuitry configured to enforce a maximum current limit to limit a current drawn by the boost converter and in response to the output voltage decreasing below the input voltage, dynamically increase the current above the maximum current limit to cause the output voltage to be approximately equal to the input voltage.

18 Claims, 7 Drawing Sheets

(56) References Cited

U.S. PATENT DOCUMENTS

| | | |
|---|---|---|
| 7,906,939 B2 | 3/2011 | Kung et al. |
| 9,088,247 B2 | 7/2015 | Amo et al. |
| 9,577,587 B2 | 2/2017 | Maru et al. |
| 9,639,102 B2 | 5/2017 | Dally |
| 9,742,393 B2 | 8/2017 | Pavao-Moreira et al. |
| 9,768,689 B1 | 9/2017 | Pazhayaveetil et al. |
| 10,263,523 B1 | 4/2019 | Sonntag et al. |
| 10,476,392 B1 | 11/2019 | Matsuura et al. |
| 10,673,423 B2 | 6/2020 | Forghani-Zadeh et al. |
| 10,720,835 B2 | 7/2020 | King et al. |
| 10,734,885 B2 | 8/2020 | King et al. |
| 2005/0264268 A1 | 12/2005 | Ueno |
| 2008/0129219 A1 | 6/2008 | Smith et al. |
| 2008/0278136 A1 | 11/2008 | Murtojarvi |
| 2009/0266397 A1 | 10/2009 | Gibson et al. |
| 2010/0019702 A1 | 1/2010 | Jang et al. |
| 2010/0156175 A1 | 6/2010 | Wei |
| 2011/0075446 A1 | 3/2011 | Doutreloigne et al. |
| 2011/0285375 A1 | 11/2011 | DeBoy |
| 2012/0205974 A1 | 8/2012 | McCaslin et al. |
| 2012/0268094 A1 | 10/2012 | Scaldaferri et al. |
| 2013/0106188 A1 | 5/2013 | Ishibashi et al. |
| 2014/0197814 A1 | 7/2014 | Shi et al. |
| 2016/0352225 A1 | 12/2016 | Langlinais et al. |
| 2017/0005647 A1 | 1/2017 | Pan et al. |
| 2017/0040895 A1* | 2/2017 | May ............... H02M 3/158 |
| 2017/0072812 A1 | 3/2017 | Von Novak et al. |
| 2017/0346446 A1* | 11/2017 | May ............... H02M 3/1584 |
| 2019/0181754 A1 | 6/2019 | Ash et al. |
| 2019/0245444 A1 | 8/2019 | Kimura |
| 2020/0186095 A1* | 6/2020 | King ............... H02M 3/158 |
| 2020/0235712 A1 | 7/2020 | May et al. |
| 2020/0388118 A1 | 12/2020 | Rosenberg et al. |
| 2021/0083578 A1 | 3/2021 | King et al. |
| 2021/0159798 A1 | 5/2021 | Mackay et al. |
| 2021/0364560 A1 | 11/2021 | Holland et al. |
| 2021/0367510 A1 | 11/2021 | Lawrence et al. |
| 2021/0367513 A1 | 11/2021 | Mackay et al. |
| 2021/0367514 A1 | 11/2021 | Lawrence et al. |
| 2021/0367515 A1 | 11/2021 | Mackay et al. |
| 2021/0367517 A1 | 11/2021 | Lawrence et al. |

FOREIGN PATENT DOCUMENTS

| | | | |
|---|---|---|---|
| EP | 2775599 | A1 | 9/2014 |
| EP | 3214746 | A1 | 9/2017 |
| EP | 3240171 | A1 | 11/2017 |
| FR | 2851091 | A1 | 8/2004 |
| GB | 2555902 | A | 5/2018 |
| TW | 201228201 | A | 7/2012 |
| WO | 2012135778 | A1 | 10/2012 |
| WO | 2017027393 | A1 | 2/2017 |
| WO | 2019135820 | A1 | 7/2019 |

OTHER PUBLICATIONS

Freescale Semiconductor, Inc., Multimedia Applications Division, i.MX233 Power Management Unit and Battery Charger—Application Note, Document No. AN3883, Rev. 0, 36 pages, Jul. 2009.
Texas Instruments, TPS6128x Low-, Wide-Voltage Battery Front-End DC/DC Converter Single-Cell Li-Ion, Ni-Rich, Si-Anode Applications—Data sheet, SLVSBI1A, 57 pages, Oct. 2013, Revised Sep. 2014.
Texas Instruments, Designing Robust TPS65217 Systems for VIN Brownout—Application Report, 13 pages, Oct. 2017.
Renesas Electronics Corporation, Preventing Subsystem Brownouts in Mobile Devices—White Paper, 6 pages.
MFJ Enterprises, Inc., MFJ—Super Battery Booster—Model MFJ-4416C—Instruction Manual, Version 0A, 16 pages, 2017.
International Search Report and Written Opinion of the International Searching Authority, International Application No. PCT/US2020/056782, dated Mar. 4, 2021.
Van Vroonhoven, Caspar, A 0-to-60V-Input Vcm Coulomb Counter with Signal-Dependent Supply Current and ±30 0.5% Gain Inaccuracy from −50° C. to 125° C., 2020 IEEE International Solid-State Circuits Conference, Feb. 19, 2020.
International Search Report and Written Opinion of the International Searching Authority, International Application No. PCT/US2021/029631, dated Jul. 23, 2021.
Qiu et al., "Digital Average Current-Mode Control of PWM DC-DC Converts without Current Sensors", IEEE Transactions on Industrial Electronics, IEEE Service Center, vol. 57, No. 5, May 10, 2010, Piscataway, NJ, USA.
International Search Report and Written Opinion of the International Searching Authority, International Application No. PCT/US2021/029584, dated Jul. 30, 2021.
International Search Report and Written Opinion of the International Searching Authority, International Application No. PCT/US2021/032474, dated Aug. 3, 2021.
Vinnikov et al., "Solar Optiverter—A Novel Hybrid Approach to the PHotovoltaic Module Level Power Electronics", IEEE Transactions on Industrial Electronics, IEEE Service Center, vol. 66, No. 5, May 1, 2019, pp. 3869-3880, Piscataway, NJ, USA.
International Search Report and Written Opinion of the International Searching Authority, International Application No. PCT/US2021/032496, dated Aug. 4, 2021.
International Search Report and Written Opinion of the International Searching Authority, International Application No. PCT/US2021/030932, dated Aug. 20, 2021.
International Search Report and Written Opinion of the International Searching Authority, International Application No. PCT/US2021/039356, dated Oct. 1, 2021.
International Search Report and Written Opinion of the International Searching Authority, International Application No. PCT/US2020/047237, dated Oct. 30, 2020.
Stala, Robert et al., "A Switched-Capacitor DC-DC Converter with Variable Number of Voltage Gains and Fault-Tolerant Operation", IEEE Transactions on Industrial Electronics, IEEE Service Center, Piscataway, NJ, US, vol. 66, No. 5, May 1, 2019.
International Search Report and Written Opinion of the International Searching Authority, International Application No. PCT/US2020/039509, dated Oct. 8, 2021.
International Search Report and Written Opinion of the International Searching Authority, International Application No. PCT/US2020/041535, dated Oct. 14, 2021.
International Search Report and Written Opinion of the International Searching Authority, International Application No. PCT/US2021/039373, dated Sep. 22, 2021.
Yu, Yangwei: "Choosing the Boost with Bypass or Pass Through", Jun. 30, 2017, Retrieved from the Internet Sep. 10, 2021.
Texas Instruments: TPS61291 Loe IQ Boost Converter with Bypass Operation, Sep. 30, 2014, Retrieved from the Internet Sep. 10, 2021.
Search Report under Section 17, UKIPO, Application No. GB2106142.9, dated Oct. 20, 2021.
Combined Search and Examination Report under Sections 17 and 18(3), UKIPO, Application No. GB2106144.5, dated Oct. 25, 2021.
International Search Report and Written Opinion of the International Searching Authority, International Application No. PCT/US2021/041547, dated Nov. 2, 2021.
International Search Report and Written Opinion of the International Searching Authority, International Application No. PCT/US2021/041918, dated Nov. 10, 2021.
International Search Report and Written Opinion of the International Searching Authority, International Application No. PCT/US2021/041544, dated Nov. 10, 2021.
International Search Report and Written Opinion of the International Searching Authority, International Application No. PCT/US2022/037855, dated Oct. 26, 2022.

* cited by examiner

PSEUDO-BYPASS MODE FOR POWER CONVERTERS

RELATED APPLICATION

The present disclosure claims priority to U.S. Provisional Patent Application Ser. No. 63/236,739 filed Aug. 25, 2021, which is incorporated by reference herein in its entirety.

FIELD OF DISCLOSURE

The present disclosure relates in general to circuits for electronic devices, including without limitation personal audio devices such as wireless telephones and media players, and more specifically, to implementation of a mode of operation of a power converter that regulates an output voltage generated by the power converter to an input voltage provided to the power converter.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers. Oftentimes, a power converter may be used to provide a supply voltage to a power amplifier in order to amplify a signal driven to speakers, headphones, or other transducers. A switching power converter is a type of electronic circuit that converts a source of power from one direct current (DC) voltage level to another DC voltage level. Examples of such switching DC-DC converters include but are not limited to a boost converter, a buck converter, a buck-boost converter, an inverting buck-boost converter, and other types of switching DC-DC converters. Thus, using a power converter, a DC voltage such as that provided by a battery may be converted to another DC voltage used to power the power amplifier. A power converter may be used to provide supply voltage rails to one or more components in a device. A power converter may also be used in other applications besides driving audio transducers, such as driving haptic actuators or other electrical or electronic loads.

An output voltage generated by a boost converter may droop below its set point under current-limited constraints that may be placed on the boost converter. A system (e.g., mobile device) comprising such a boost converter may require the output voltage generated by the boost converter to not fall below an input voltage to the boost converter which is referred to herein as "a collapse condition." Typically, such requirement may be accomplished by closing a switch between the input voltage and output voltage during collapse conditions, resulting in a state transition between a regulation mode in which the boost converter regulates the output voltage and a bypass mode. However, such a state transition may add design complexity and have other disadvantages.

SUMMARY

In accordance with the teachings of the present disclosure, one or more disadvantages and problems associated with existing approaches to regulating an output voltage of a power converter may be reduced or eliminated.

In accordance with embodiments of the present disclosure, a system may include a boost converter configured to receive an input voltage and boost the input voltage to an output voltage and control circuitry configured to enforce a maximum current limit to limit a current drawn by the boost converter and in response to the output voltage decreasing below the input voltage, dynamically increase the current above the maximum current limit to cause the output voltage to be approximately equal to the input voltage.

In accordance with these and other embodiments of the present disclosure, a method may include enforcing a maximum current limit to limit a current drawn by a boost converter configured to receive an input voltage and boost the input voltage to an output voltage and in response to the output voltage decreasing below the input voltage, dynamically increasing the current above the maximum current limit to cause the output voltage to be approximately equal to the input voltage.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
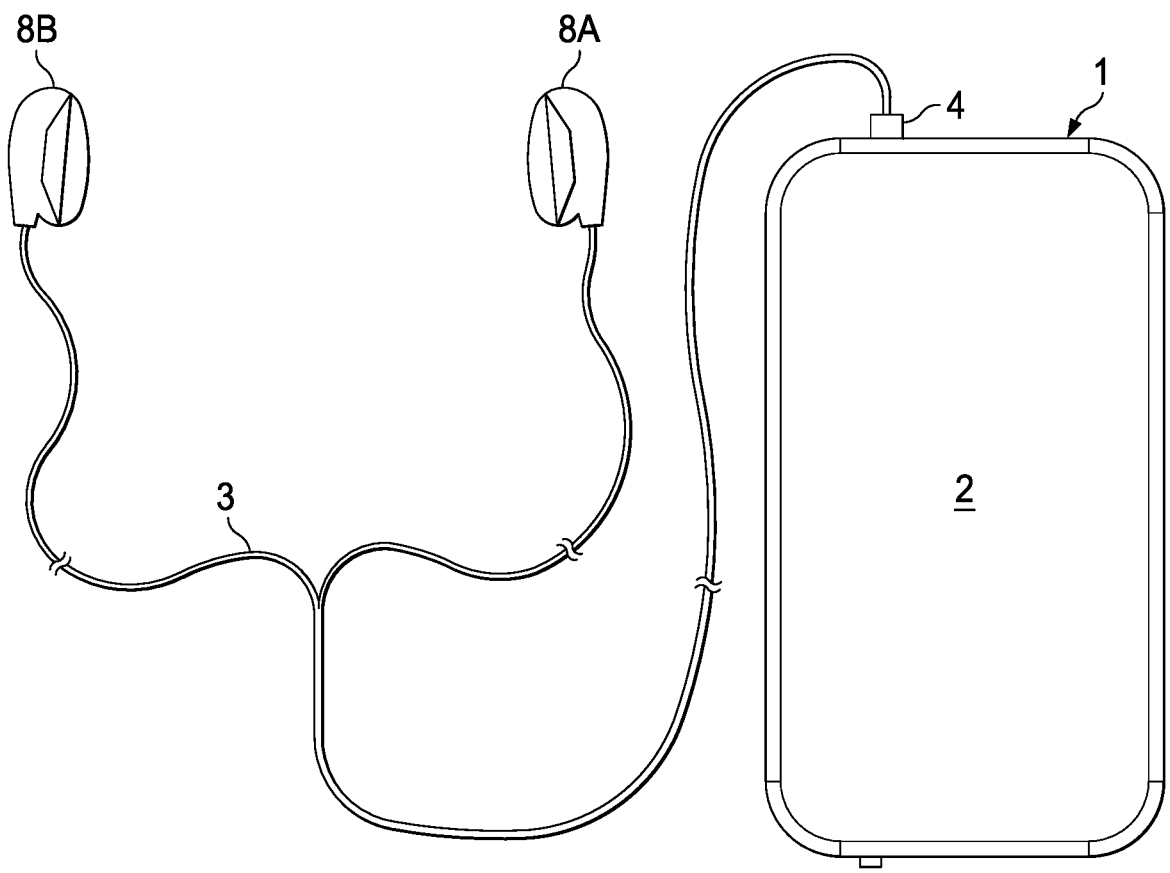
FIG. 1 illustrates an example mobile device, in accordance with embodiments of the present disclosure.

FIG. 1 illustrates an example mobile device 1, in accordance with embodiments of the present disclosure. FIG. 1 depicts mobile device 1 coupled to a headset 3 in the form of a pair of earbud speakers 8A and 8B. Headset 3 depicted in FIG. 1 is merely an example, and it is understood that mobile device 1 may be used in connection with a variety of audio transducers, including without limitation, headphones, earbuds, in-ear earphones, and external speakers. A plug 4 may provide for connection of headset 3 to an electrical terminal of mobile device 1. Mobile device 1 may provide a display to a user and receive user input using a touch screen 2, or alternatively, a standard liquid crystal display (LCD) may be combined with various buttons, sliders, and/or dials disposed on the face and/or sides of mobile device 1.

Figure 2:
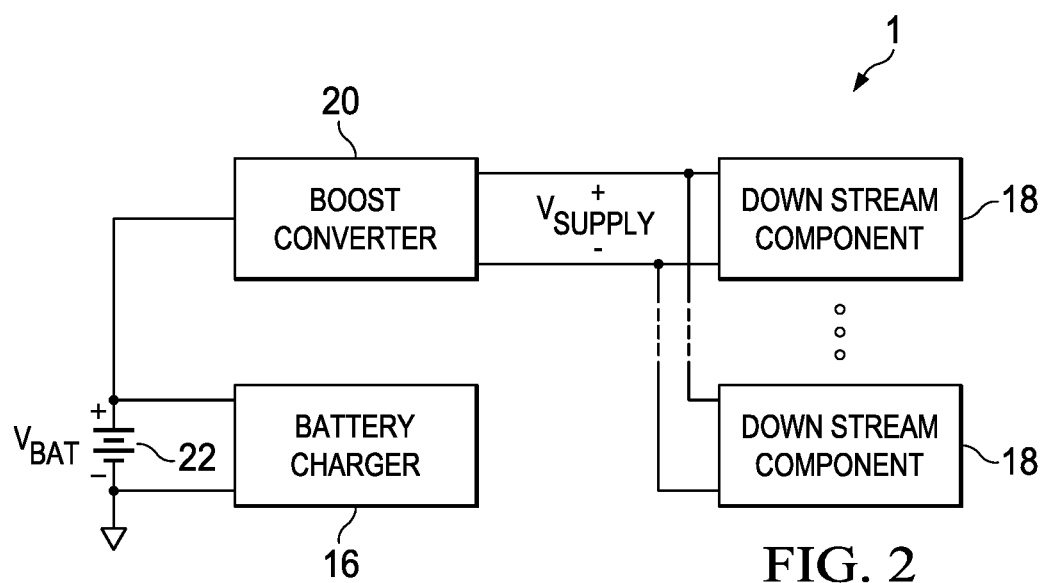
FIG. 2 illustrates a block diagram of selected components internal to a mobile device, in accordance with embodiments of the present disclosure.

FIG. 2 illustrates a block diagram of selected components integral to mobile device 1, in accordance with embodiments of the present disclosure. As shown in FIG. 2, mobile device 1 may include a boost converter 20 configured to boost a battery voltage $V_{BAT}$ to generate a supply voltage $V_{SUPPLY}$ to a plurality of downstream components 18 of mobile device 1. Downstream components 18 of mobile device 1 may include any suitable functional circuits or devices of mobile device 1, including without limitation processors, audio coder/decoders, amplifiers, display devices, etc. As shown in FIG. 2, mobile device 1 may also include a battery charger 16 for recharging battery 22.

In some embodiments of mobile device 1, boost converter 20 and battery charger 16 may comprise the only components of mobile device 1 electrically coupled to battery 22, and boost converter 20 may electrically interface between battery 22 and all downstream components of mobile device 1. However, in other embodiments of mobile device 1, some downstream components 18 may electrically couple directly to battery 22.

Figure 3A:
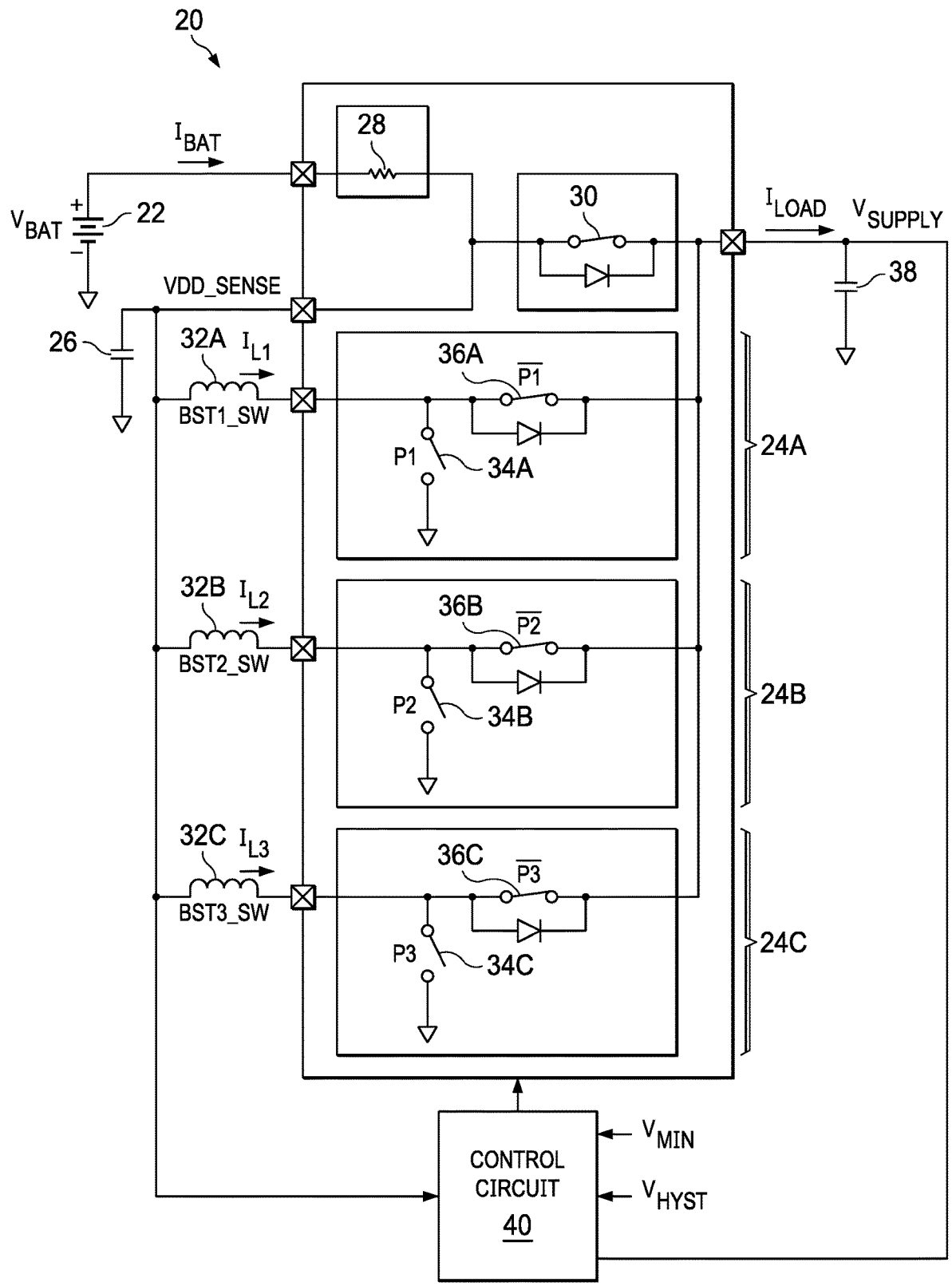
FIG. 3A illustrates a block diagram of selected components of an example boost converter with multiple modes of operation depicting operation in a bypass mode, in accordance with embodiments of the present disclosure.

FIG. 3A illustrates a block diagram of selected components of an example boost converter 20 with multiple modes of operation depicting operation in a bypass mode, in accordance with embodiments of the present disclosure. As shown in FIG. 3A, boost converter 20 may include a battery 22, a plurality of inductive boost phases 24, a sense capacitor 26, a sense resistor 28, a bypass switch 30, and a control circuit 40. As shown in FIG. 3A, each inductive boost phase 24 may include a power inductor 32, a charge switch 34, a rectification switch 36, and output capacitor 38.

Figure 3B:
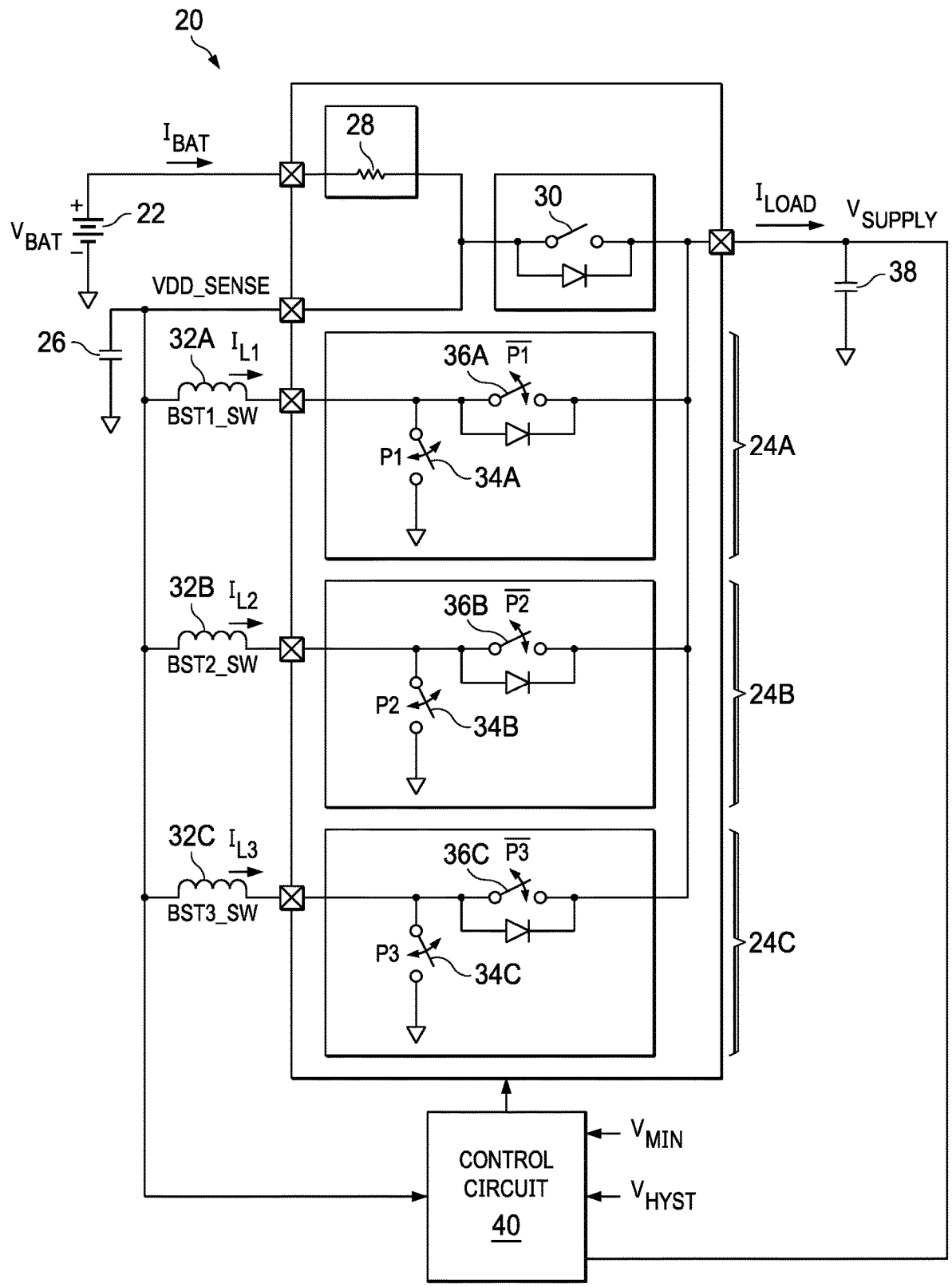
FIG. 3B illustrates a block diagram of selected components of an example boost converter with multiple modes of operation depicting operation in a boost active mode, in accordance with embodiments of the present disclosure.
Figure 3C:
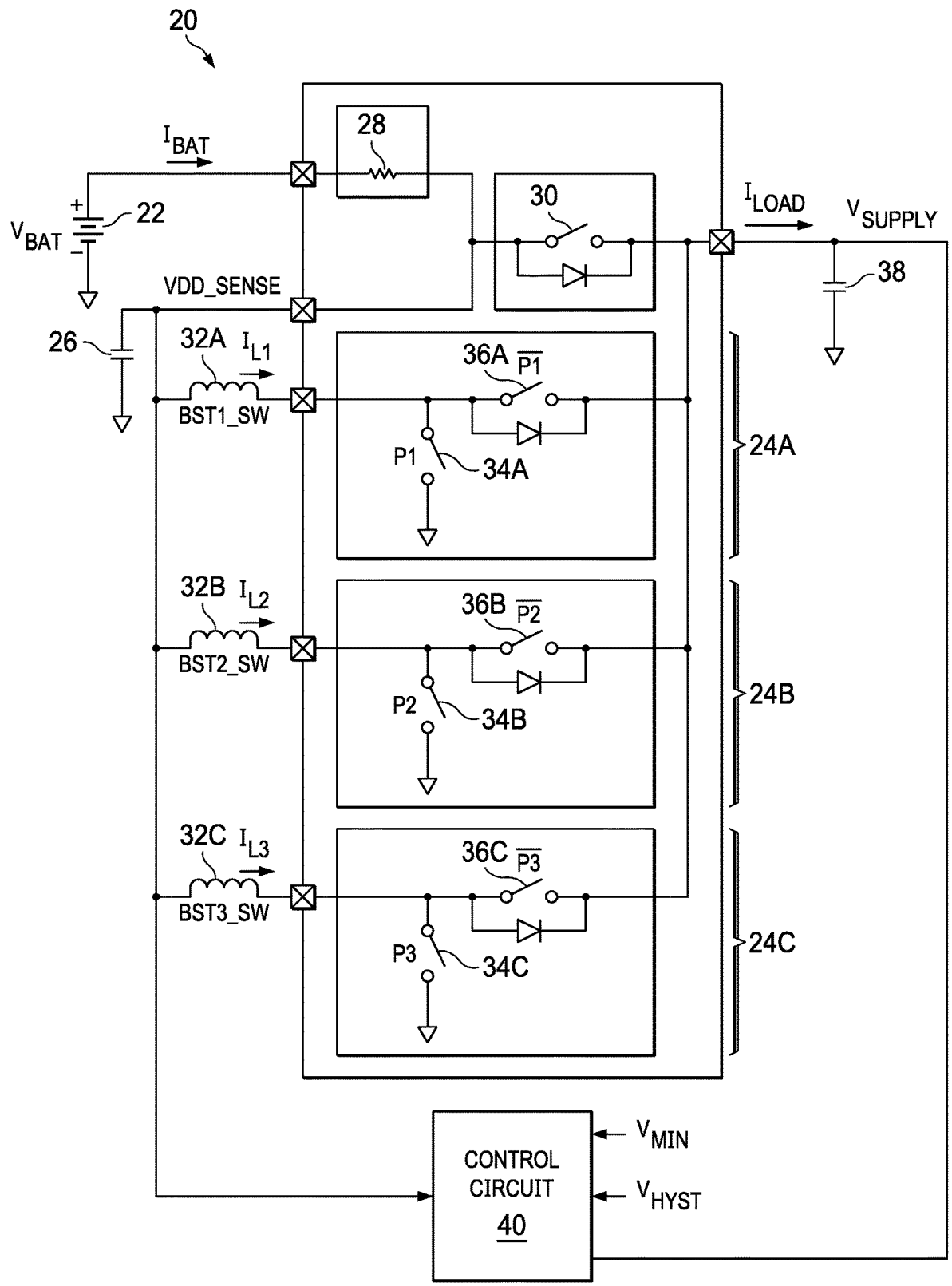
FIG. 3C illustrates a block diagram of selected components of an example boost converter with multiple modes of operation depicting operation in a boost inactive mode, in accordance with embodiments of the present disclosure.

Although FIGS. 3A-3C depict boost converter 20 having three inductive boost phases 24, embodiments of boost converter 20 may have any suitable number of inductive boost phases 24. In some embodiments, boost converter 20 may comprise three or more inductive boost phases 24. In other embodiments, boost converter 20 may comprise fewer than three phases (e.g., a single phase or two phases).

Boost converter 20 may operate in the bypass mode when supply voltage $V_{SUPPLY}$ generated by boost converter 20 is greater than a threshold minimum voltage $V_{MIN}$ and a voltage VDD_SENSE across sense capacitor 26 is greater than supply voltage $V_{SUPPLY}$. In some embodiments, such threshold minimum voltage $V_{MIN}$ may be a function of a monitored current (e.g., a current through sense resistor 28). In some embodiments, such threshold minimum voltage $V_{MIN}$ may be varied in accordance with variations in the monitored current, in order to provide desired headroom from components supplied from supply voltage $V_{SUPPLY}$. Thus, control circuit 40 may be configured to sense supply voltage $V_{SUPPLY}$ and compare supply voltage $V_{SUPPLY}$ to threshold minimum voltage $V_{MIN}$, as well as sense voltage VDD_SENSE and compare supply voltage $V_{SUPPLY}$ to voltage VDD_SENSE. In the event that supply voltage $V_{SUPPLY}$ is greater than threshold minimum voltage $V_{MIN}$ and VDD_SENSE across sense capacitor 26 is greater than supply voltage $V_{SUPPLY}$, control circuit 40 may activate (e.g., enable, close, turn on) bypass switch 30 and one or more rectification switches 36 and deactivate (e.g., disable, open, turn off) charge switches 34. In such bypass mode, the resistances of rectification switches 36, power inductors 32, and bypass switch 30 may combine to minimize a total effective resistance of a path between battery 22 and supply voltage $V_{SUPPLY}$. In some embodiments, bypass switch 30 may not be present, and the bypass mode may be accomplished by activating one or more rectification switches 36 and deactivating charge switches 34.

FIG. 3B illustrates a block diagram of selected components of example boost converter 20 depicting operation in a boost active mode, in accordance with embodiments of the present disclosure. In the boost active mode, control circuit 40 may deactivate (e.g., disable, open, turn off) bypass switch 30, and periodically commutate charge switches 34 (e.g., during a charging state of an inductive boost phase 24) and rectification switches 36 (e.g., during a transfer state of an inductive boost phase 24) of inductive boost phase 24 (as described in greater detail below) by generating appropriate control signals $P_1$, $\overline{P_1}$, $P_2$, $\overline{P_2}$, $P_3$, and $\overline{P_3}$, to deliver a current $I_{BAT}$ and boost battery voltage $V_{BAT}$ to a higher supply voltage $V_{SUPPLY}$ in order to provide a programmed (or servoed) desired current (e.g., average current) to the electrical node of supply voltage $V_{SUPPLY}$, while maintaining supply voltage $V_{SUPPLY}$ above threshold minimum voltage $V_{MIN}$. For example, control circuit 40 may operate in the boost active mode to maintain an inductor current $I_L$ (e.g., $I_{L1}$, $I_{L2}$, $I_{L3}$) between a peak current and a valley current as described in U.S. patent application Ser. No. 17/119,517 filed Dec. 11, 2020 (the "'517 applications"), and incorporated by reference herein in its entirety. In the boost active mode, control circuit 40 may operate boost converter 20 by operating inductive boost phase 24 in a peak and valley detect operation, as described in greater detail below. The resulting switching frequency of charge switches 34 and rectification switches 36 of inductive boost phase 24 may be determined by the sense voltage VDD_SENSE, supply voltage $V_{SUPPLY}$, an inductance of power inductor 32A, and a programmed ripple parameter (e.g., a configuration of a target current ripple for an inductor current $I_L$).

FIG. 3C illustrates a block diagram of selected components of boost converter 20 depicting operation in a boost inactive mode, in accordance with embodiments of the present disclosure. Boost converter 20 may operate in the boost inactive mode when supply voltage $V_{SUPPLY}$ generated by boost converter 20 rises above hysteresis voltage $V_{HYST}$ and a sense voltage VDD_SENSE remains below supply voltage $V_{SUPPLY}$. In the boost inactive mode, control circuit 40 may deactivate (e.g., disable, open, turn off) bypass switch 30, charge switches 34, and rectification switches 36. Thus, when sense voltage VDD_SENSE remains below supply voltage $V_{SUPPLY}$, control circuit 40 prevents boost converter 20 from entering the bypass mode in order to not backpower battery 22 from supply voltage $V_{SUPPLY}$. Further, if supply voltage $V_{SUPPLY}$ should fall below threshold minimum voltage $V_{MIN}$, control circuit 40 may cause boost converter 20 to again enter the boost active mode in order to maintain supply voltage $V_{SUPPLY}$ between threshold minimum voltage $V_{MIN}$ and hysteresis voltage $V_{HYST}$.

Accordingly, via operation in the above-described modes, boost converter 20 may operate to provide hysteretic regulation of supply voltage $V_{SUPPLY}$ between threshold minimum voltage $V_{MIN}$ and a hysteresis voltage $V_{HYST}$.

It is understood that in some embodiments of the present disclosure, bypass switch 30 may be absent from boost converter 20. Accordingly, as described in greater detail below, in addition to or in lieu of the bypass function provided by bypass switch 30, boost converter 20 may be configured to regulate supply voltage $V_{SUPPLY}$ at approximately battery voltage $V_{BAT}$ during a voltage collapse condition that may exist at supply voltage $V_{SUPPLY}$ as a result of current limiting of boost converter 20.

As described in U.S. patent application Ser. No. 17/237,373 filed Apr. 22, 2021 (the "'373 applications"), and incorporated by reference herein, one or more constraints may be placed on operation of a power converter which may place one or more limits on current that may be drawn from a battery by a power converter. In some instances, such current limits as applied to boost converter 20 may lead to a collapse condition, in which supply voltage $V_{SUPPLY}$ falls to battery voltage $V_{BAT}$, and thus power converter 20 is not able to regulate supply voltage $V_{SUPPLY}$. As described in the Background section, in traditional approaches, control circuit 40 may activate bypass switch 30 (and/or one or more of rectification switches 36) to bypass battery voltage $V_{BAT}$ to supply voltage $V_{SUPPLY}$ as a result of current limiting of boost converter 20. However, in accordance with the present disclosure, boost converter 20 may be configured to regulate supply voltage $V_{SUPPLY}$ approximately equal to battery voltage $V_{BAT}$ in the event of a collapse condition.

Figure 4:
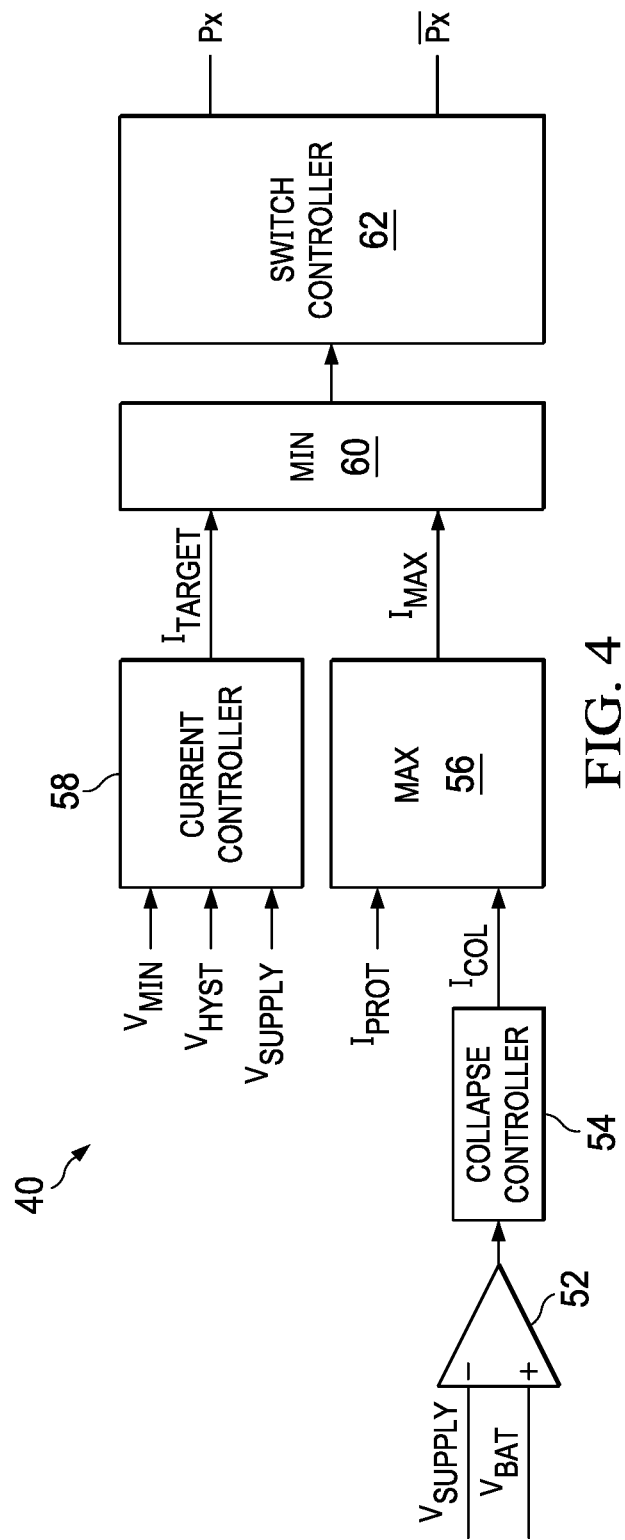
FIG. 4 illustrates a block diagram of selected components of an example control circuit for a boost converter, in accordance with embodiments of the present disclosure.

FIG. 4 illustrates a block diagram of selected components of example control circuit 40, in accordance with embodiments of the present disclosure. As shown in FIG. 4, control circuit 40 may include a comparator 52, collapse controller 54, a maximum block 56, a current controller 58, a minimum block 60, and a switch controller 62.

Comparator 52 may be configured to compare supply voltage $V_{SUPPLY}$ to battery voltage $V_{BAT}$, in order to control operation of collapse controller 54. For example, if supply voltage $V_{SUPPLY}$ is greater than battery voltage $V_{BAT}$, comparator 52 may cause collapse controller 54 to operate in a release mode in which it decreases a collapse condition current $I_{COL}$. On the other hand, if supply voltage $V_{SUPPLY}$ is lesser than battery voltage $V_{BAT}$, comparator 52 may cause collapse controller 54 to operate in an attack mode in which it increases collapse condition current $I_{COL}$.

Maximum block 56 may select the maximum of a protection current $I_{PROT}$ and collapse condition current $I_{COL}$ to generate a maximum current $I_{MAX}$ communicated to minimum block 60. Protection current $I_{PROT}$ may represent a maximum current that can be drawn by boost converter 20 in order to satisfy any battery protection constraints and/or other protection constraints, for example as described in the '373 applications. Thus, in the presence of a collapse condition, collapse controller 54 in conjunction with maximum block 56 may temporarily override such protection current $I_{PROT}$ in order to regulate supply voltage $V_{SUPPLY}$.

Current controller 58 may, based on supply voltage $V_{SUPPLY}$, threshold minimum voltage $V_{MIN}$, hysteresis voltage $V_{HYST}$, and/or any other suitable parameters, determine a target current $I_{TARGET}$ to be drawn by boost converter 20 in order to regulate supply voltage $V_{SUPPLY}$ at a desired voltage level. The determination of such target current based on supply voltage $V_{SUPPLY}$ is beyond the scope of this disclosure, but may be determined in any suitable manner, including without limitation an approach that determines a target average current as described in the '517 applications.

Minimum block 60 may select the minimum of target current $I_{TARGET}$ and maximum current $I_{MAX}$ and communicate the result to switch controller 62. Based on the current value received, switch controller 62 may generate appropriate control signals $P_1$, $P_2$, $P_3$ and to commutate switches 34 and 36 of boost converter 20 in order to draw such target current $I_{TARGET}$.

In operation, functionality of collapse controller 54 may be integrated with maximum block 56 to implement a state machine in order to generate maximum current $I_{MAX}$. As noted above, maximum current $I_{MAX}$ may be based on protection current $I_{PROT}$ for satisfying battery protection constraints and the output of comparator 52. When not in a collapse condition, maximum current $I_{MAX}$ may equal protection current $I_{PROT}$. On the other hand, when in a collapse condition, maximum current $I_{MAX}$ may exceed protection current $I_{PROT}$.

Figure 5:
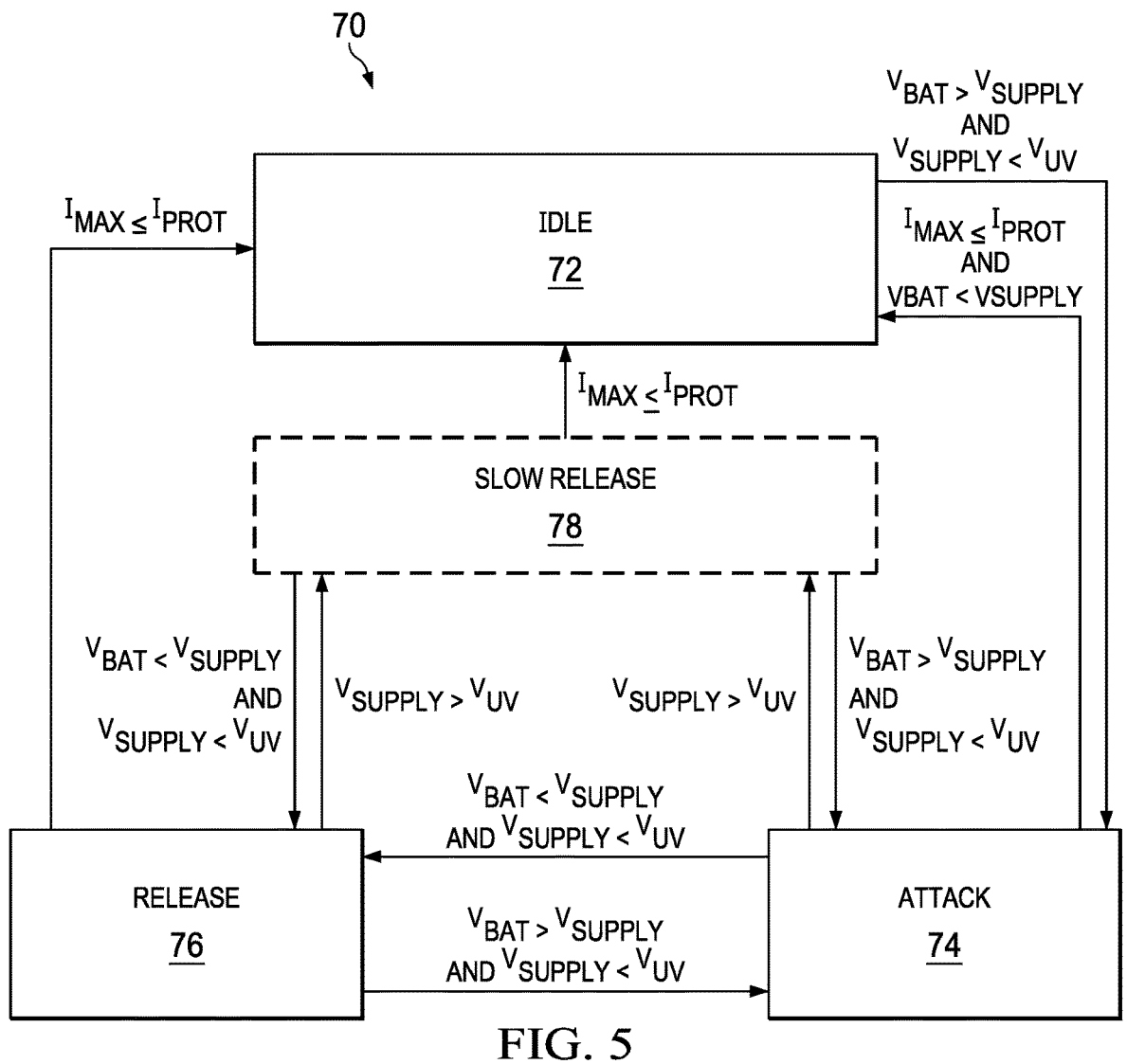
FIG. 5 depicts an example state machine that may be implemented by portions of the control circuit for the boost converter, in accordance with embodiments of the present disclosure.

FIG. 5 depicts an example state machine 70 that may be implemented by collapse controller 54 and maximum block 56, in accordance with embodiments of the present disclosure. As shown in FIG. 5, state machine 70 may include four states: an idle state 72, an attack state 74, a release state 76, and a slow release state 78. Slow release state 78 is shown in dashed lines as such state may not be present in some embodiments of state machine 70.

In idle state 72, maximum current $I_{MAX}$ may equal protection current $I_{PROT}$. From idle state 72, state machine 70 may transition to attack state 74 in response to battery voltage $V_{BAT}$ exceeding supply voltage $V_{SUPPLY}$ and supply voltage $V_{SUPPLY}$ falling below a minimum acceptable regulation voltage $V_{UV}$ (which may be equal to or below threshold minimum voltage $V_{MIN}$ described above).

Collapse controller 54 may cause maximum current $I_{MAX}$ to continually increase while in attack state 74. From attack state 74, state machine 70 may transition back to idle state 72 in response to maximum current $I_{MAX}$ falling below protection current $I_{PROT}$ and battery voltage $V_{BAT}$ falling below supply voltage $V_{SUPPLY}$. In addition, from attack state 74, state machine 70 may transition to release state 76 in response to supply voltage $V_{SUPPLY}$ exceeding battery voltage $V_{BAT}$ and supply voltage $V_{SUPPLY}$ remaining below minimum acceptable regulation voltage $V_{UV}$. Further, from attack state 74, state machine 70 may transition to slow release state 78 in response to supply voltage $V_{SUPPLY}$ exceeding minimum acceptable regulation voltage $V_{UV}$.

Collapse controller 54 may cause maximum current $I_{MAX}$ to continually decrease while in release state 76. From release state 76, state machine 70 may transition back to idle state 72 in response to maximum current $I_{MAX}$ falling below protection current $I_{PROT}$. In addition, from release state 76, state machine 70 may transition back to attack state 74 in response to battery voltage $V_{BAT}$ exceeding supply voltage $V_{SUPPLY}$ and supply voltage $V_{SUPPLY}$ remaining below minimum acceptable regulation voltage $V_{UV}$. Further, from release state 76, state machine 70 may transition to slow release state 78 in response to battery voltage $V_{BAT}$ exceeding supply voltage $V_{SUPPLY}$ and supply voltage $V_{SUPPLY}$ rising above minimum acceptable regulation voltage $V_{UV}$.

Slow release state 78 may only be present in embodiments in which boost converter 20 has a dedicated bypass switch 30 which may be activated when supply voltage $V_{SUPPLY}$ equals battery voltage $V_{BAT}$ and supply voltage $V_{SUPPLY}$ is above minimum acceptable regulation voltage $V_{UV}$. If collapse controller 54 is engaged (e.g., $I_{MAX} > I_{PROT}$) and supply voltage $V_{SUPPLY}$ is above minimum acceptable regulation voltage $V_{UV}$, the control loop implemented by collapse controller 54 may be required to gracefully avoid adverse interaction with bypass switch 30. Such adverse interaction may be achieved by maximum current $I_{MAX}$ continually decreasing while in slow release state 78, but at a rate which may be slower than the decrease in maximum current $I_{MAX}$ occurring in release state 76.

In slow release state 78, collapse controller 54 may decrease maximum current $I_{MAX}$ at a programmable rate slower than the rate of decrease in release state 76, which may reduce chattering of supply voltage $V_{SUPPLY}$ near the boundary of minimum acceptable regulation voltage $V_{UV}$.

From slow release state 78, state machine 70 may transition back to idle state 72 in response to maximum current $I_{MAX}$ falling below protection current $I_{PROT}$. In addition, from slow release state 78, state machine 70 may transition back to attack state 74 in response to battery voltage $V_{BAT}$ exceeding supply voltage $V_{SUPPLY}$ and supply voltage $V_{SUPPLY}$ falling below minimum acceptable regulation voltage $V_{UV}$. Further, from slow release state 78, state machine 70 may transition to release state 76 in response to supply voltage $V_{SUPPLY}$ exceeding battery voltage $V_{BAT}$ and supply voltage $V_{SUPPLY}$ falling below minimum acceptable regulation voltage $V_{UV}$.

Notably, minimum acceptable regulation voltage $V_{UV}$ may only be relevant in state machine 70 in embodiments in which dedicated bypass switch 30 is present. Accordingly, in embodiments in which dedicated bypass switch 30 is absent and state machine 70 does not include slow release state 78, the comparisons to minimum acceptable regulation voltage $V_{UV}$ shown in FIG. 5 may be ignored.

Figure 6:
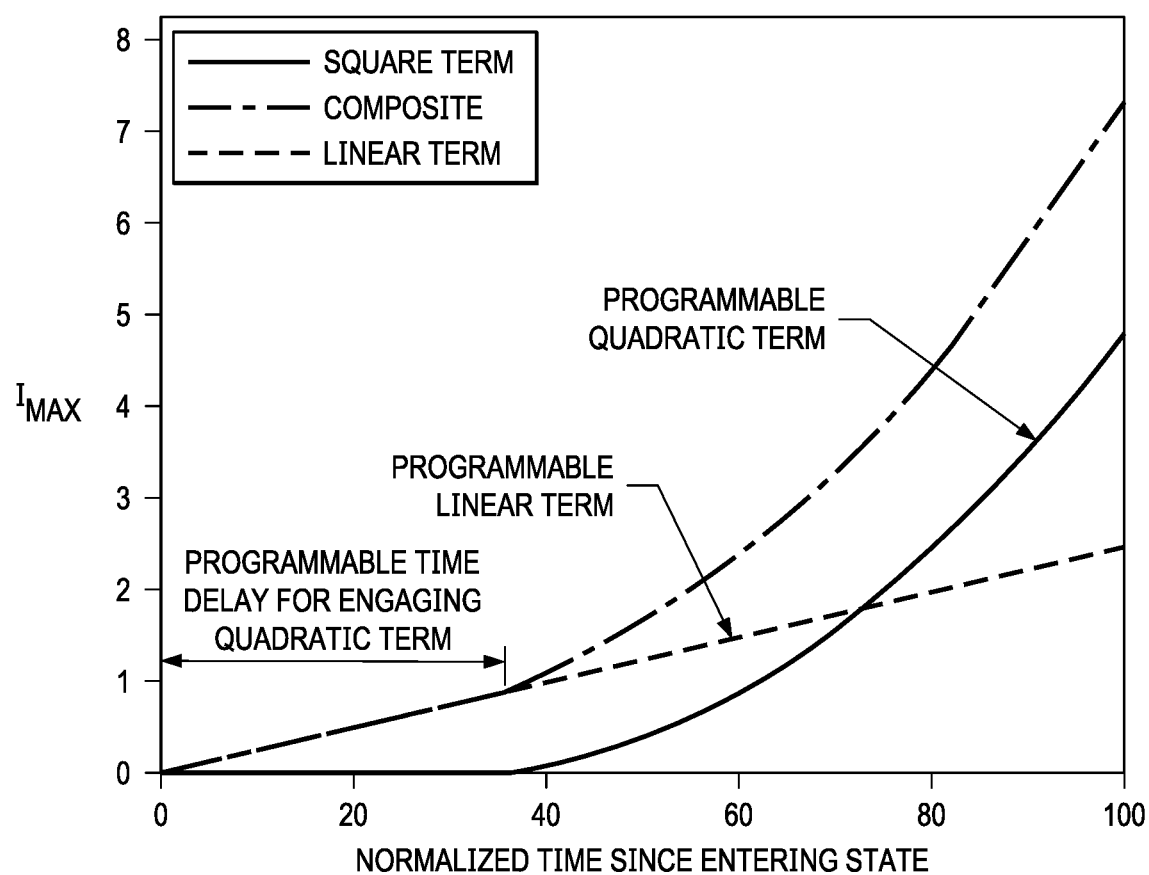
FIG. 6 illustrates a graph depicting increase in a maximum current versus time in an attack state, in accordance with embodiments of the present disclosure.

When entering attack state 74, collapse controller 54 may continually increase maximum current $I_{MAX}$ during the duration of time that state machine 70 remains in attack state 74. In some embodiments, as shown in FIG. 6, such increase of maximum current $I_{MAX}$ may include a programmable linear term (e.g., linearly increasing with time), a programmable quadratic term (e.g., exponentially increasing with time), and a programmable time delay after the beginning of attack state 74 at which the quadratic term is added to the linear term to generate a composite curve for maximum current $I_{MAX}$. Such composite ramp may allow steady state stability via the linear term and fast tracking of supply voltage $V_{SUPPLY}$ versus battery voltage $V_{BAT}$ via the quadratic term. Collapse controller 54 may generate a similar composite curve of decreasing maximum current $I_{MAX}$ during release state 76 and slow release state 78.

In addition to the example waveforms described above, other waveforms that are dependent on time, current, and/or voltage may be used.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this applications in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a boost converter configured to receive an input voltage and boost the input voltage to an output voltage; and
   control circuitry configured to:
      enforce a maximum current limit to limit a current drawn by the boost converter; and
      in response to the output voltage decreasing below the input voltage, dynamically increase the current above the maximum current limit to cause the output voltage to be approximately equal to the input voltage.

2. The system of claim 1, wherein the maximum current limit is based on a determination of a maximum current level that ensures protection of components of the boost converter or components electrically coupled to the boost converter.

3. The system of claim 1, wherein the control circuitry implements a feedback loop that controls the current to regulate the output voltage based on the output voltage and the input voltage.

4. The system of claim 1, wherein the control circuitry is further configured to:

continuously increase the current when the output voltage is less than the input voltage and the current is greater than the maximum current limit; and continuously decrease the current when the output voltage is greater than the input voltage and the current is greater than the maximum current limit.

5. The system of claim 4, wherein:

when the output voltage is less than the input voltage and the current is greater than the maximum current limit, a rate of increase of the current is nonlinear; and when the output voltage is greater than the input voltage and the current is greater than the maximum current limit, a rate of decrease of the current is nonlinear.

6. The system of claim 5, wherein:

the rate of increase is a function of an amount of time since the control circuitry entered an attack state in which the output voltage is less than the input voltage and the current is greater than the maximum current limit; and the rate of decrease is a function of an amount of time since the control circuitry entered a release state in which the output voltage is greater than the input voltage and the current is greater than the maximum current limit.

7. The system of claim 4, wherein the control circuitry is further configured to continuously increase the current when the output voltage is greater than the input voltage and the output voltage is less than a threshold voltage.

8. The system of claim 4, wherein the control circuitry is further configured to continuously decrease the current when the output voltage is greater than the threshold voltage and the current is greater than the maximum current limit, wherein a second rate of decrease occurring when the output voltage is greater than the threshold voltage and the current is greater than the maximum current limit is different than the rate of decrease when the output voltage is greater than the input voltage and the current is lesser than the maximum current limit.

9. The system of claim 8, further wherein a second rate of decrease occurring when the output voltage is greater than the threshold voltage and the current is greater than the maximum current limit is less than the rate of decrease when the output voltage is greater than the input voltage and the current is lesser than the maximum current limit.

10. A method comprising:

enforcing a maximum current limit to limit a current drawn by a boost converter configured to receive an input voltage and boost the input voltage to an output voltage; and in response to the output voltage decreasing below the input voltage, dynamically increasing the current above the maximum current limit to cause the output voltage to be approximately equal to the input voltage.

11. The method of claim 10, wherein the maximum current limit is based on a determination of a maximum current level that ensures protection of components of the boost converter or components electrically coupled to the boost converter.

12. The method of claim 10, further comprising implementing a feedback loop that controls the current to regulate the output voltage based on the output voltage and the input voltage.

13. The method of claim 10, further comprising:

continuously increasing the current when the output voltage is less than the input voltage and the current is greater than the maximum current limit; and continuously decreasing the current when the output voltage is greater than the input voltage and the current is greater than the maximum current limit.

14. The method of claim 13, wherein:

when the output voltage is less than the input voltage and the current is greater than the maximum current limit, a rate of increase of the current is nonlinear; and when the output voltage is greater than the input voltage and the current is greater than the maximum current limit, a rate of decrease of the current is nonlinear.

15. The method of claim 14, wherein:

the rate of increase is a function of an amount of time since the control circuitry entered an attack state in which the output voltage is less than the input voltage and the current is greater than the maximum current limit; and the rate of decrease is a function of an amount of time since the control circuitry entered a release state in which the output voltage is greater than the input voltage and the current is greater than the maximum current limit.

16. The method of claim 13, further comprising continuously increasing the current when the output voltage is greater than the input voltage and the output voltage is less than a threshold voltage.

17. The method of claim 13, further comprising continuously decreasing the current when the output voltage is greater than the threshold voltage and the current is greater than the maximum current limit, wherein a second rate of decrease occurring when the output voltage is greater than the threshold voltage and the current is greater than the maximum current limit is different than the rate of decrease when the output voltage is greater than the input voltage and the current is lesser than the maximum current limit.

18. The method of claim 17, further wherein a second rate of decrease occurring when the output voltage is greater than the threshold voltage and the current is greater than the maximum current limit is less than the rate of decrease when the output voltage is greater than the input voltage and the current is lesser than the maximum current limit.

\* \* \* \* \*

UNITED STATES PATENT AND TRADEMARK OFFICE
CERTIFICATE OF CORRECTION

PATENT NO. : 11,843,317 B2
APPLICATION NO. : 17/550492
DATED : December 12, 2023
INVENTOR(S) : Akram et al.

It is certified that error appears in the above-identified patent and that said Letters Patent is hereby corrected as shown below:

In the Claims

1. In Column 9, Line 32, in Claim 8, delete "the threshold voltage" and insert -- a threshold voltage --, therefor.

2. In Column 10, Line 41, in Claim 17, delete "the threshold voltage" and insert -- a threshold voltage --, therefor.

Signed and Sealed this
Twenty-ninth Day of October, 2024

Katherine Kelly Vidal
*Director of the United States Patent and Trademark Office*